United States Patent
Higuchi et al.

(10) Patent No.: US 8,120,178 B2
(45) Date of Patent: Feb. 21, 2012

(54) TUNING FORK VIBRATION DEVICE AND METHOD FOR MANUFACTURING THE SAME

(75) Inventors: Takamitsu Higuchi, Matsumoto (JP); Makoto Eguchi, Suwa (JP)

(73) Assignee: Seiko Epson Corporation (JP)

( * ) Notice: Subject to any disclaimer, the term of this patent is extended or adjusted under 35 U.S.C. 154(b) by 606 days.

(21) Appl. No.: 11/692,365

(22) Filed: Mar. 28, 2007

(65) Prior Publication Data
US 2007/0227333 A1  Oct. 4, 2007

(30) Foreign Application Priority Data
Mar. 29, 2006  (JP) .................................. 2006-090254

(51) Int. Cl.
   *H01L 21/00*  (2006.01)
(52) U.S. Cl. ................ 257/750; 257/E27.006; 257/773; 257/786; 438/3
(58) Field of Classification Search ... 438/3; 73/504.16; 257/E27.006, 750, 773, 786
See application file for complete search history.

(56) References Cited

U.S. PATENT DOCUMENTS

| | | | | |
|---|---|---|---|---|
| 6,119,518 | A | * | 9/2000 | Itou et al. .................... 73/504.16 |
| 2004/0132310 | A1 | * | 7/2004 | Nakatani et al. .............. 438/706 |
| 2004/0245894 | A1 | * | 12/2004 | Tanaya et al. ................. 310/348 |
| 2005/0040737 | A1 | * | 2/2005 | Tanaya .......................... 310/370 |

FOREIGN PATENT DOCUMENTS

| | | |
|---|---|---|
| JP | 2005-197946 | 7/2005 |
| JP | 2005-249395 | 9/2005 |
| JP | 2005-291858 | 10/2005 |
| JP | 2006-030062 | 2/2006 |

* cited by examiner

*Primary Examiner* — Kevin Parendo
(74) *Attorney, Agent, or Firm* — Harness, Dickey & Pierce, P.L.C.

(57) ABSTRACT

A tuning fork vibration device includes: a SOI substrate having a substrate, an oxide layer formed above the substrate and a semiconductor layer formed above the oxide layer; a tuning fork type vibration section that is formed by processing the semiconductor layer and the oxide layer and composed of the semiconductor layer; and a driving section for generating flexural vibration of the vibration section, wherein the vibration section includes a support section and two beam sections formed in a cantilever shape with the support section as a base of the beam sections, and the driving section includes a pair of drivers formed on each of the two beam sections, each of the drivers including a first electrode layer, a piezoelectric layer formed above the first electrode layer and a second electrode layer formed above the piezoelectric layer.

9 Claims, 2 Drawing Sheets

TUNING FORK VIBRATION DEVICE AND METHOD FOR MANUFACTURING THE SAME

The entire disclosure of Japanese Patent Application No. 2006-090254, filed Mar. 29, 2006 is expressly incorporated by reference herein.

BACKGROUND

1. Technical Field

The present invention relates to a tuning fork vibration device having a tuning fork vibration section formed on a SOI substrate which is driven by vibration of a piezoelectric layer.

2. Related Art

The development of communication devices such as clocks, personal computers and the like is trending toward a reduction in size and a reduction in power consumption; and for this reason, a reduction in size and a reduction in power consumption of clock modules are demanded. As a vibration device that is used in an oscillator section of a clock module, a 32 kHz tuning fork vibration device is still used in order to take advantage of its conventional design resource and power saving property. The tuning fork vibration device has a structure in which a piezoelectric such as quartz that is processed in a tuning fork configuration is interposed between electrodes in a manner to be driven, and has various advantages such as excellent temperature characteristics and excellent power saving property. However, in the case of a 32 kHz tuning fork vibration device, the arm length of the tuning fork is several mm, and the overall length including its packaging amounts to about 10 mm.

In recent years, vibration devices that use a piezoelectric thin film formed on a silicon substrate, instead of quartz, have been developed. Such vibration devices have a laminate structure in which a piezoelectric thin film is interposed between upper and lower electrodes, and generate flexural vibration due to expansion and contraction movements in a plane. As the structure of such vibration devices, a beam type structure (see FIG. 1 of Japanese Laid-open patent application JP-A-2005-291858) and a structure in which a tuning fork vibration device is formed with two beams (see FIG. 1 of Japanese Laid-open patent application JP-A-2005-249395) are known.

It is noted that, in the vibration devices using a piezoelectric thin film formed on a silicon substrate, the silicon substrate can only be made to a thickness of about 100 µm at most, such that the sound speed of flexural vibration can be lowered only to about several 100 m/s. In order to obtain a resonance frequency at several tens kHz band, the arm-length of the beam needs to be several mm or greater, which causes a problem in that miniaturization of the clock module is difficult.

SUMMARY

In accordance with an aspect of the present invention, there is provided a tuning fork vibration device that is extremely small in size, and by which, for example, a resonance frequency at a several tens kHz band can be obtained.

In accordance with an embodiment of the invention, a tuning fork vibration device includes: a SOI substrate having a substrate, an oxide layer formed above the substrate and a semiconductor layer formed above the oxide layer; a tuning fork type vibration section that is formed by processing the semiconductor layer and the oxide layer and composed of the semiconductor layer; and a driving section for generating flexural vibration of the vibration section, wherein the vibration section includes a support section and two beam sections formed in a cantilever shape with the support section as a base of the beam sections, and the driving section includes a pair of drivers formed on each of the two beam sections, wherein each of the drivers includes a first electrode layer, a piezoelectric layer formed above the first electrode layer and a second electrode layer formed above the piezoelectric layer.

According to the tuning fork vibration device in accordance with the invention, the drivers are formed from semiconductor layers of the SOI substrate, such that the thickness of the vibration section and the length of the beam sections can be made smaller. As a result, a desired resonance frequency, for example, a resonance frequency suitable for a clock module can be obtained, while the device can be reduced in size. For example, in accordance with an aspect of the embodiment of the invention, the thickness of the vibration section may be 20 µm or less, and the length of the vibration section may be 2 mm or less.

It is noted that, in the invention, the case in which a specific member B (hereafter referred to as a "member B") is provided above another specific member A (hereafter referred to as a "member A") includes a case in which the member B is directly provided on the member A, and a case in which the member B is provided over the member A through another member.

In accordance with an aspect of the embodiment of the invention, the resonance frequency of the vibration section may be at a 32 kHz band. The resonance frequency at the 32 kHz band is suitable for a clock module, and the resonance frequency may also be in the range between, for example, 16 kHz and 66 kHz. In order to generate a signal at 1 Hz by dividing a frequency by a 15-stage flip-flop circuit, the frequency needs to be $2^{15}$=32.768 kHz. However, since 14 stages and 16 stages may possibly be used in view of power consumption, the range can be between $2^{14}$=16.384 kHz and $2^{16}$=65.536 kHz.

In accordance with an aspect of the embodiment of the invention, the piezoelectric layer may be composed of lead zirconate titanate, or solid solution of lead zirconate titanate.

A method for manufacturing a tuning fork vibration device in accordance with an embodiment of the invention includes the steps of successively forming a first electrode layer, a piezoelectric layer and a second electrode layer above a SOI substrate having a substrate, an oxide layer formed above the substrate and a semiconductor layer formed above the oxide layer; patterning the first electrode layer, the piezoelectric layer and the second electrode layer to form a driving section; patterning the semiconductor layer to form a vibration section; and patterning the oxide layer to form an opening section below the vibration section, wherein the vibration section is formed to have a support section and two beam sections formed in a cantilever shape with the support section as a base of the beam sections, and the driving section is formed to have a pair of drivers provided on each of the two beam sections, wherein each of the drivers is formed to include a first electrode layer, a piezoelectric layer formed above the first electrode layer and a second electrode layer formed above the piezoelectric layer.

According to the manufacturing method in accordance with the invention, a tuning fork vibration device can be readily manufactured by using a known MEMS (Micro Electro Mechanical Systems) technology.

DESCRIPTION OF EXEMPLARY EMBODIMENTS

Preferred embodiments of the present invention are described below with reference to the accompanying drawings.

1. Tuning Fork Vibration Device

Figure 1:
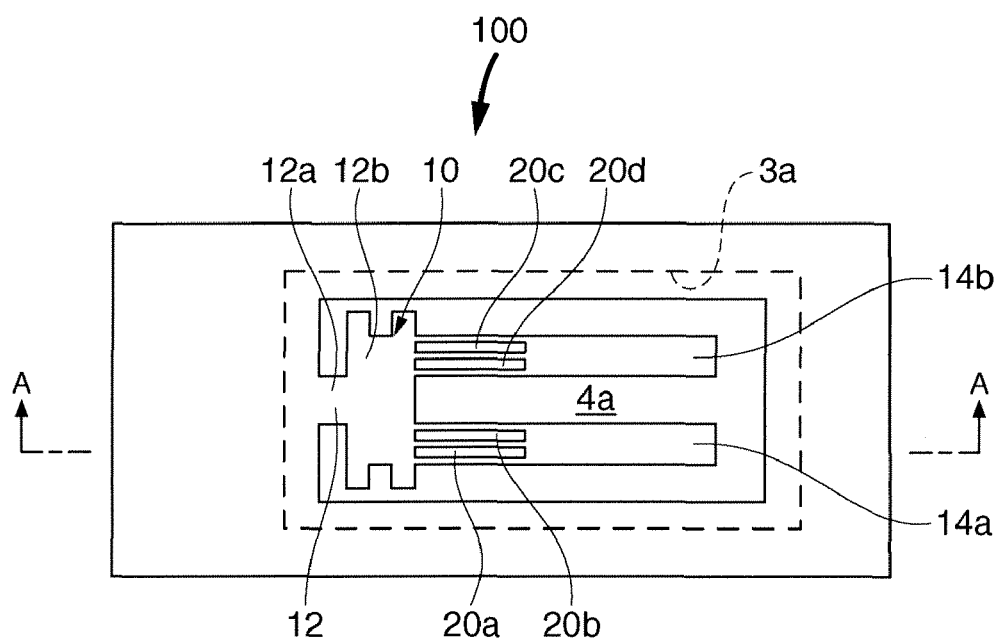
FIG. 1 is a plan view schematically showing the structure of a tuning fork vibration device in accordance with a first embodiment of the invention.
Figure 2:
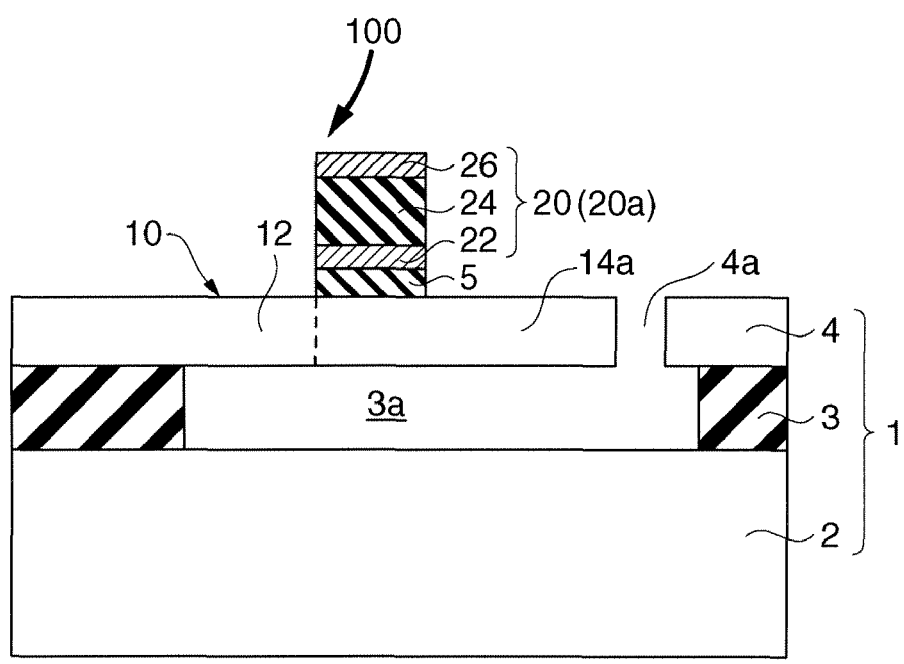
FIG. 2 is a cross-sectional view taken along lines A-A of FIG. 1.

FIG. 1 is a plan view schematically showing the structure of a tuning fork vibration device 100 in accordance with an embodiment of the invention, and FIG. 2 is a cross-sectional view of the structure taken along lines A-A of FIG. 1.

As shown in FIG. 1, the tuning fork vibration device 100 includes a SOI substrate 1, a tuning fork type vibration section 10 formed in the SOI substrate 1, and a driving section 20 for generating flexural vibration of the vibration section 10.

The SOI substrate 1 is formed from a silicon substrate 2, and an oxide layer (a silicon oxide layer) 3 and a silicon layer 4 successively laminated on the silicon substrate 2. The thickness of the silicon substrate 4 may preferably be 20 μm or less, so that the tuning fork vibration device 100 can be made smaller in size. The SOI substrate 1 may also be used as a semiconductor substrate, and a variety of semiconductor circuits can be formed in the SOI substrate 1, such that the tuning fork vibration device 10 and a semiconductor integrated circuit can be formed in one piece. Above all, the use of a silicon substrate is advantageous because an ordinary semiconductor manufacturing technology can be used.

The vibration section 10 has a tuning fork shape in its plane configuration, as shown in FIG. 1, and is formed over an opening section 3a that is formed by removing a portion of the oxide layer 3 in the SOI substrate 1, as shown in FIG. 2. Also, a gap section 4a that allows vibration of the vibration section 10 is formed around the vibration section 10. Further, the vibration section 10 includes a support section 12 and two beam sections (first and second beam sections) 14a and 14b formed in a cantilever shape with the support section 12 as a base of the beam sections. The first beam section 14a and the second beam section 14b are disposed in parallel with each other in their longitudinal direction and spaced at a predetermined gap from each other.

Also, the support section 12 includes a first support section 12a that is continuous with the silicon layer 4, and a second support section 12b wider than the first support section 12a. The second support section 12b functions to support the first beam section 14a and the second beam section 14b, and also functions to prevent vibration of the beam sections 14a and 14b from propagating to the first support section 12a. In order to provide such functions, the second support section 12b may have a concave-convex shape on its side sections.

The driving section 20 includes a pair of drivers formed on each of the first beam section 14a and the second beam section 14b. More specifically, a first driver 20a and a second driver 20b are formed on the first beam section 14a along the longitudinal direction of the first beam section 14a in parallel with each other. Similarly, a third driver 20c and a fourth driver 20d are formed on the second beam section 14b along the longitudinal direction of the second beam section 14b in parallel with each other. Further, the first driver 20a disposed on the outer side of the first beam section 14a and the third driver 20c disposed on the outer side of the second beam section 14b are electrically connected to each other by a wiring not shown. Also, the second driver 20b disposed on the inner side of the first beam section 14a and the fourth driver 20d disposed on the inner side of the second beam section 14b are electrically connected to each other by a wiring not shown. Accordingly, upon application of an AC electric filed to these wirings, the first beam section 14a and the second beam section 14b flex and vibrate mirror-symmetrically with each other, such that tuning fork vibration is realized.

The driving section 20 (20a through 20d) has, as shown in FIG. 2, a first electrode layer 22 formed on the base layer 5, a piezoelectric layer 24 formed above the first electrode layer 22, and a second electrode layer 26 formed above the piezoelectric layer 24.

The base layer 5 is formed from a dielectric film, such as, for example, a silicon oxide ($SiO_2$) layer, a silicon nitride ($Si_3N_4$) layer or the like, and may be formed from a compound layer of two layers or more. The first electrode layer 22 may be composed of any electrode material, such as, for example, Pt. The first electrode layer 22 may have any thickness as long as a sufficiently low electrical resistance value can be obtained, and may be 10 nm or greater but 5 μm or less.

The piezoelectric layer 24 may be composed of any piezoelectric material, such as, for example, lead zirconate titanate. The thickness of the piezoelectric layer 24 may preferably be about 1/10 to 1/1 the thickness of the silicon layer 4. This is for securing a driving force that can sufficiently vibrate the silicon layer that composes the beam sections 14a and 14b. Accordingly, when the thickness of the silicon layer 4 is between 1 μm and 20 μm, the thickness of the piezoelectric layer 24 may be between 100 nm and 20 μm.

The second electrode layer 26 may be composed of any electrode material, such as, for example, Pt. The second electrode layer 26 may have any thickness as long as a sufficiently low electrical resistance value can be obtained, and may be 10 nm or greater but 5 μm or less.

In the present embodiment, only the piezoelectric layer 26 is present between the first electrode layer 22 and the second electrode layer 26. However, a layer other than the piezoelectric layer 24 may also be provided between the electrode layers 22 and 26. In this case, the film thickness of the piezoelectric layer 24 may be appropriately changed according to the resonance condition.

Next, composition examples of the tuning fork vibration device 100 in accordance with the embodiment are described.

(A) In accordance with a first example, in the tuning fork vibration device 100, the thickness of the first electrode layer 22 is 0.1 μm, the thickness of the piezoelectric layer 24 is 2 μm, the thickness of the second electrode layer 26 is 0.1 μm, the thickness of the driving section 20 is 2.2 μm, the thickness of the silicon layer 4 is 20 μm, the beam length of the beam sections 14a and 14b is 1280 μm, and the beam width is 40 μm. Further, the vibration section 10 is disposed inside a gap section 4a having a wide side of 2000 μm and a narrow side of 100 μm. A resonance frequency of flexural vibration of the tuning fork vibration device 100 having the structure described above, in simulation by solving an equation of motion using a finite element method, is 32 kHz.

(B) In accordance with a second example, in the tuning fork vibration device 100, the thickness of the first electrode layer 22 is 0.1 μm, the thickness of the piezoelectric layer 24 is 1 μm, the thickness of the second electrode layer 26 is 0.1

μm, the thickness of the driving section 20 is 1.2 μm, the thickness of the silicon layer 4 is 2 μm, the beam length of the beam sections 14a and 14b is 410 μm, and the beam width is 4 μm. Further, the vibration section 10 is disposed inside a gap section 4a having a wide side of 1000 μm and a narrow side of 10 μm. A resonance frequency of flexural vibration of the tuning fork vibration device 100 having the structure described above, in simulation by solving an equation of motion using a finite element method, is 32 kHz.

According to the tuning fork vibration device 100 in accordance with the present embodiment, when the tuning fork vibration device 100 is composed with the SOI substrate 1, the film thickness of the vibration section 10 can be made extremely small, for example, to 20 μm or less. As a result, according to the tuning fork vibration device 100, the length of the beam sections 14a and 14b required for generating a resonance frequency of an oscillator that is used as a clock module can be made shorter, and therefore its size can be made considerably smaller, compared to a conventional tuning fork vibration device that uses quartz. For example, when the tuning fork vibration device 100 of the present embodiment is used as a 32 kHz band oscillator, the oscillator can be miniaturized in a package less than 3 mm in length.

In this manner, when the tuning fork vibration device 100 of the present embodiment is used as a clock module, the tuning fork vibration device 100 can be mounted on an electronic device having a SOI substrate having a semiconductor circuit integrated therein. As a result, the package can be considerably made small in size, while providing the function of a 32 kHz band frequency oscillator. Also, according to the tuning fork vibration device 100 of the present embodiment, a 32 kHz band oscillator can be used as a trigger generator even in a circuit that does not essentially require a timing device such as an asynchronous circuit.

Also, according to the present embodiment, the tuning fork vibration device 100 can be formed in the SOI substrate 1, such that an oscillation circuit and the tuning fork vibration device can be integrated in one piece in the SOI substrate 1. As a result, a single-chip clock module with extremely low power consumption can be realized, while taking advantage of the lower operation voltage characteristic of the device using the SOI substrate 1.

2. Method for Manufacturing Tuning Fork Vibration Device

Next, an example of a method for manufacturing a tuning fork vibration device 100 in accordance with an embodiment of the invention is described with reference to FIGS. 3 through 5.

Figure 3:
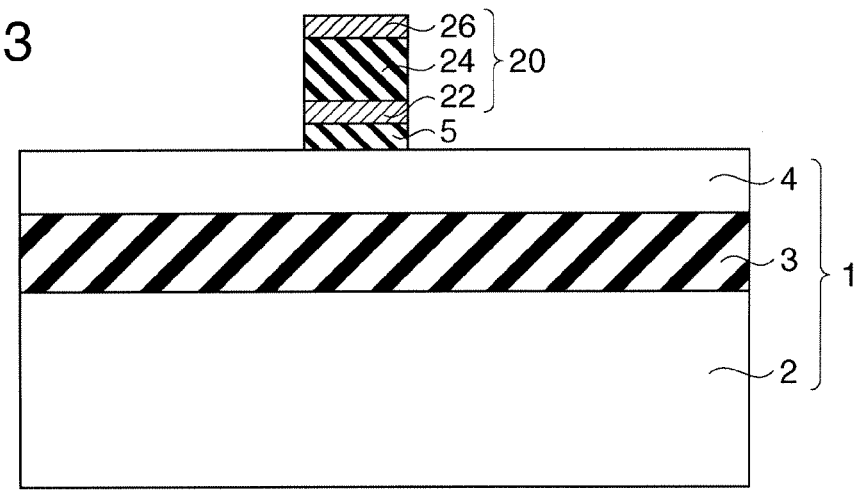
FIG. 3 is a cross-sectional view schematically showing a step of a method for manufacturing a tuning fork vibration device in accordance with an embodiment of the invention.

(1) As shown in FIG. 3, a base layer 5, a first electrode layer 22, a piezoelectric layer 24 and a second electrode layer 26 are successively formed on a SOI substrate 1. The SOI substrate 1 is formed from an oxide layer (a silicon oxide layer) 3 and a silicon layer 4 successively formed on a silicon substrate 2.

The base layer 5 may be formed by a thermal oxidation method, a CVD method, a sputter method or the like. The base layer 5 is patterned and formed in a desired configuration. The patterning may be conducted by ordinary photolithography and etching technique.

The first electrode layer 22 may be formed on the base layer 5 by using a vapor deposition method, a sputter method or the like. The first electrode layer 22 is patterned and formed in a desired configuration. The patterning may be conducted by ordinary photolithography and etching technique.

The piezoelectric layer 24 may be formed by a variety of methods, such as, a vapor deposition method, a sputter method, a laser ablation method, a CVD method or the like. For example, when the piezoelectric layer 24 composed of lead zirconate titanate is formed by a laser ablation method, a laser beam is irradiated to a lead zirconate titanate target, for example, a target of $Pb_{1.05}Zr_{0.52}Ti_{0.48}NbO_3$. Lead atoms, zirconium atoms, titanium atoms and oxygen atoms are discharged by ablation from the target, a plume is generated by laser energy, and the plume is irradiated toward the SOI substrate 1. As a result, the piezoelectric layer 24 composed of lead zirconate titanate is formed on the first electrode layer 22. The piezoelectric layer 24 is patterned into a desired configuration. The patterning may be conducted by ordinary photolithography and etching technique.

The second electrode layer 26 may be formed by using a vapor deposition method, a sputter method or the like. The second electrode layer 26 is patterned and formed in a desired configuration. The patterning may be conducted by ordinary photolithography and etching technique.

Figure 4:
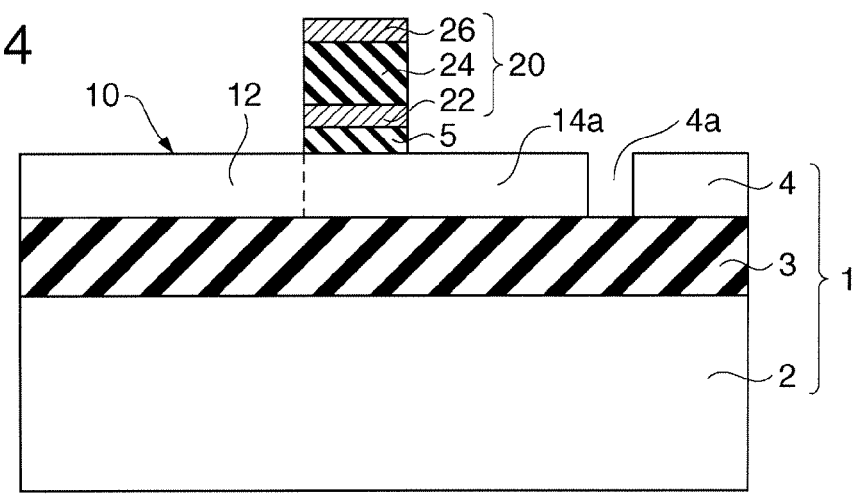
FIG. 4 is a cross-sectional view schematically showing a step of the method for manufacturing a tuning fork vibration device in accordance with the embodiment of the invention.

(2) As shown in FIG. 4, the silicon layer 4 of the SOI substrate 1 is patterned into a desired configuration. Concretely, the silicon layer 4 is patterned such that a driving section 10 having a desired plane configuration is formed in a gap section 4a, as shown in FIG. 1. The silicon layer 4 can be patterned by known photolithography and etching technique. The etching may be dry etching or wet etching. In this patterning step, the oxide layer 3 in the SOI substrate 1 can be used as an etching stopper layer.

Figure 5:
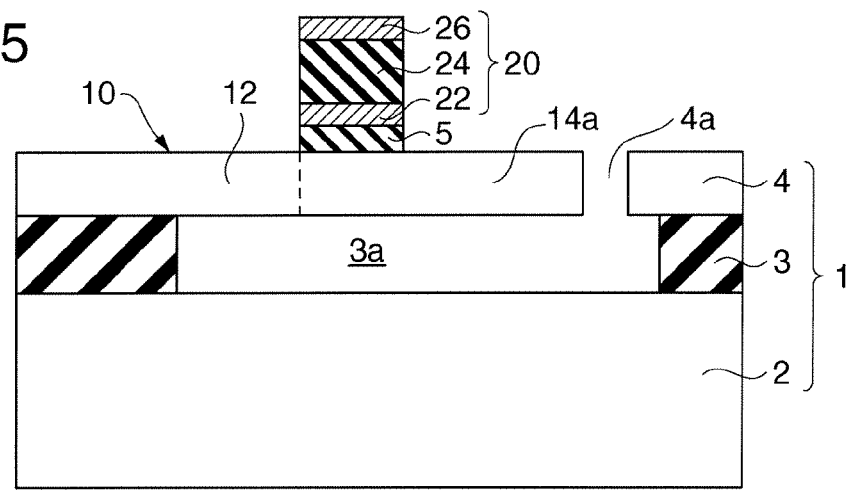
FIG. 5 is a cross-sectional view schematically showing a step of the method for manufacturing a tuning fork vibration device in accordance with the embodiment of the invention.

(3) As shown in FIG. 5, the oxide layer 3 of the SOI substrate 1 is etched, thereby forming an opening section 3a below the vibration section 10. The etching may be conducted by wet etching using, for example, hydrogen fluoride as an etchant of the silicon oxide. When forming the opening section 3a, the silicon substrate 2 and the silicon layer 4 can be used as etching stopper layers. By providing the gap section 2a and the opening section 3a described above, the mechanical restraining force on the tuning fork vibration device 10 is reduced, and the tuning fork vibration device 10 can freely vibrate.

Through the steps described above, the tuning fork vibration device 100 shown in FIG. 1 and FIG. 2 is formed. According to the manufacturing method of the present embodiment, a tuning fork vibration device can be readily formed by using known MEMS technology.

The invention is not limited to the embodiments described above, and many modifications can be made. For example, the invention may include compositions that are substantially the same as the compositions described in the embodiments (for example, a composition with the same function, method and result, or a composition with the same objects and result). Also, the invention includes compositions in which portions not essential in the compositions described in the embodiments are replaced with others. Also, the invention includes compositions that achieve the same functions and effects or achieve the same objects of those of the compositions described in the embodiments. Furthermore, the invention includes compositions that include publicly known technology added to the compositions described in the embodiments.

What is claimed is:

1. A tuning fork vibration device comprising:
   a SOI substrate having a substrate, an oxide layer formed above the substrate, and a semiconductor layer formed above the oxide layer;
   a tuning fork type vibration section that is formed by processing the semiconductor layer and the oxide layer and is composed of the semiconductor layer; and
   a driving section for generating flexural vibration of the tuning fork type vibration section;
   wherein the tuning fork type vibration section includes a support section and two beam sections cantilevered over a first opening section formed in the oxide layer, wherein the first opening section is formed below the entirety of the support section and the beam sections, wherein the support section and the beam sections are formed in a cantilever shape with the support section as a base of the beam sections, and wherein the driving section includes a pair of drivers formed only on each of the two beam sections, each of the drivers including a first electrode layer, a piezoelectric thin film of lead zirconate titantate or a solid solution of lead zirconate titantate formed above the first electrode layer, and a second electrode layer formed above the piezoelectric thin film, and wherein a first driver disposed on an outer side of one of the two beam sections and a third driver disposed on an outer side of the other of the two beam sections are electrically connected to each other, and a second driver disposed on an inner side of the one of the two beam sections and a fourth driver disposed on an inner side of the other of the two beam sections are electrically connected to each other.

2. The tuning fork vibration device according to claim 1, wherein a thickness of the tuning fork type vibration section is 20 μm or less.

3. The tuning fork vibration device according to claim 1, wherein a length of the tuning fork type vibration section is 2 mm or less.

4. The tuning fork vibration device according to claim 1, wherein a resonance frequency of the tuning fork type vibration section is between 16 kHz and 66 kHz.

5. The tuning fork vibration device according to claim 4, wherein the resonance frequency of the vibration section is 32 kHz.

6. The tuning fork vibration device according to claim 1, wherein the support section extends from a frame section that surrounds the tuning fork type vibration section into a second opening section formed in the semiconductor layer between the tuning fork type vibration section and the frame section and above the first opening section and wherein, the frame section is composed of the semiconductor layer.

7. The tuning fork vibration device according to claim 6, wherein the support section includes a first support section that extends from the frame section in a first direction and a second support section that extends from the first support section in the first direction wherein, the second support section is wider than the first support section in a second direction perpendicular to the first direction and wherein, the second support section is being the base of the beam sections.

8. The tuning fork vibration device according to claim 7, wherein the second support section includes side sections facing in opposite directions perpendicular to the first direction, the side sections formed in a concave-convex shape.

9. The tuning fork vibration device according to claim 1, wherein a thickness of the piezoelectric thin film is greater than or equal to 100 nm and less than or equal to 2 μm.

* * * * *